United States Patent [19]

Opitz et al.

[11] 4,450,896
[45] May 29, 1984

[54] METHOD AND APPARATUS FOR HEAT EXCHANGE AT SOLID SURFACES

[75] Inventors: Heinrich Opitz, Erlangen; Bernhard Montag, Forchheim; Gerd Urban, Erlangen; Wilfried Türk, Munich, all of Fed. Rep. of Germany

[73] Assignee: Siemens Aktiengesellschaft, Munich, Fed. Rep. of Germany

[21] Appl. No.: 415,437

[22] Filed: Sep. 7, 1982

[30] Foreign Application Priority Data

Sep. 17, 1981 [DE] Fed. Rep. of Germany ....... 3137034

[51] Int. Cl.³ ............................................ F28F 13/02
[52] U.S. Cl. .................................... 165/1; 165/80 C; 165/139; 165/146; 165/170; 165/DIG. 5
[58] Field of Search .................. 165/170, 80 C, 122, 165/139, 1, 80 E, 120, 121, 146, 147, 168, 169, DIG. 5

[56] References Cited

U.S. PATENT DOCUMENTS

| 1,916,337 | 7/1933 | Schmidt | 165/95 X |
| 2,690,899 | 10/1954 | Clay | 165/80 C |
| 3,307,619 | 3/1967 | Kim | 165/80 E |
| 4,260,015 | 4/1981 | Tamburini | 165/170 X |
| 4,411,311 | 10/1983 | Touze | 165/170 |

FOREIGN PATENT DOCUMENTS

| 222502 | 1/1943 | Switzerland | 165/122 |
| 1306224 | 2/1973 | United Kingdom | 165/80 C |

*Primary Examiner*—Sheldon J. Richter
*Attorney, Agent, or Firm*—Kenyon & Kenyon

[57] ABSTRACT

The invention relates to a method and apparatus for heat exchange, especially for cooling at solid surfaces. At the solid surfaces, a locally uniform convective heat exchange is achieved. According to the invention, a sink flow is superimposed on a circular flow of a fluid in a flow chamber (1) at a surface of a heat-conducting solid wall (9) by means of a distributor, forming a vortex sink flow. The heat exchange surface of the component (9) to be cooled is at the same time the base plate (8) of a flow chamber (1).

23 Claims, 3 Drawing Figures

METHOD AND APPARATUS FOR HEAT EXCHANGE AT SOLID SURFACES

BACKGROUND OF THE INVENTION

This invention relates to a method for heat exchange at solid surfaces as well as to apparatus for implementing the method.

If current flows in electrical equipment, dissipation heat is always generated. Due to the ever increasing packing density of active and passive electronic components, higher and higher dissipation-heat current densities result. In order not to shorten the service life of the electronic components, the dissipation heat must be removed by cooling. Up to now, convective forced cooling has been sufficient. In the future, this will no longer be sufficient. Since the heat transfer coefficient of water is about 60 to 100-times larger than of air, it is advantageous to remove the electric dissipation heat with water.

According to U.S. Pat. No. 4,153,107, each individual electronic module is individually cooled by pressing a highly heat-conducting metal body against the module. The dissipation heat is distributed thereby over a large surface area of the metal body. The removal of heat from this metal body is accomplished via a thin helium-gas path to a water-cooling device. This cooling method requires a relatively large amount of technical equipment.

It is an object of the invention to improve the dissipation heat removal from hot components, particularly electrical components, and to prevent local overheating of individual components.

SUMMARY OF THE INVENTION

This object is attained by the provision that, according to the present invention, a sink flow is superimposed in a flow chamber at a surface of a heat-conducting solid wall to a circular flow of a fluid by means of a distributor, forming a so-called vortex sink flow. The back side is preferably employed as the heat-exchanging surface. Thus, the dissipation heat of components can be removed at the back sides of circuit boards penetrated by contacts in a heat-conducting manner, and locally very uniform cooling can be achieved, preventing local overheating of the individual components.

According to a preferred embodiment of the invention, the coolant is fed tangentially into the flow chamber by at least one distributor. The coolant is discharged from the flow chamber perpendicularly to the plane of the flow in the center of the vortex through heat-insulated central outflow.

The boundary-layer flow lines produced by the superposition of a circular flow on a sink flow are spirals, according to well-known laws of fluid mechanics (see FIG. 2).

In flow against solid walls, flow boundary layers with friction develop, in which the flow velocity of the core flow drops to zero, until the fluid adheres directly to the wall. In this flow boundary layer, the entire convective heat transfer resistance drops when heat is transferred between the solid wall and the fluid. Thick flow boundary layers therefore represent a high convective heat transfer resistance, and thin boundary layers represent a low convective heat transfer resistance. Thick flow boundary layers are formed if the convection is weak, i.e., if the flow velocity is low, and thin boundary layers if it is high. If the flow against a wall is horizontal, the boundary layer thickness, as well as the convective heat transfer resistance, increases continuously in the flow direction, it the flow velocity remains constant.

The present invention also relates to apparatus for implementing the method according to the invention, with the aid of which heat exchange takes place at surfaces of components. The apparatus comprises a flow chamber, the base plate of which is the heat-exchanging surface of a component to be cooled.

For carrying out the method, it is necessary to fasten the apparatus according to the invention to the heat-exchanging surface.

The central outlet of the flow chamber and the chamber lid 10 may have a heat-insulating layer.

In a vortex sink flow apparatus (SILVERTEX) according to the present invention, the increase of the boundary layer thickness and, therefore the increase of the heat transfer resistance are compensated because of the increase of the flow velocity toward the center of the vortex. The heat transfer therefore remains approximately constant over the entire heat exchanger surface.

By changing the flow cross section in the flow chamber, in particular by changing the shape of the chamber lid, any other desired local heat transfer resistance, which changes continuously with the space coordinate, can be set. Conical chamber lids increase the flow velocity from the entrance to the exit in the vortex sink flow apparatus, and funnel-shaped chamber lids reduce the velocity toward the outlet. The vortex sink flow apparatus can therefore be adapted to special heat exchange problems.

According to one advantageous embodiment of the present invention, the apparatus has at least one tangentially arranged distributor.

Suitable coolants are gaseous and liquid fluids, especially water, fluorocarbons and others. The method and the apparatus according to the present invention are suitable for heat exchange at solid surfaces. They find application to particular advantage in cooling electrical and electronic components, especially flat printed-circuit board assemblies.

DETAILED DESCRIPTION

Figure 1:
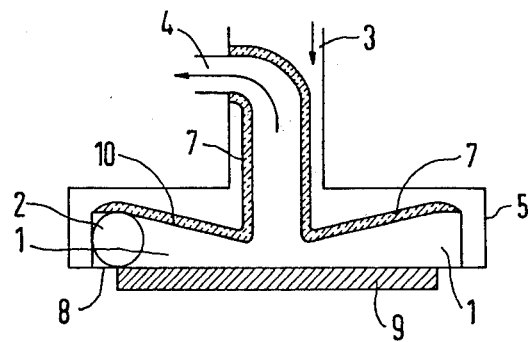
FIG. 1 is a longitudinal cross-sectional view of an apparatus for implementing a heat exchange method according to the present invention.

As illustrated in FIG. 1, a flow distributor 2 is arranged in the round housing 5 of a flow chamber 1. A tube 3 is a central inlet and a flow outlet 4 is mounted concentrically in the tube. The flow chamber 1 is enclosed by the fluid distribution housing 5. Thermal insulation is designated with reference numeral 7. The component 9 to be cooled has a contact area common with the base plate 8, namely, the heat transfer surface.

Figure 2:
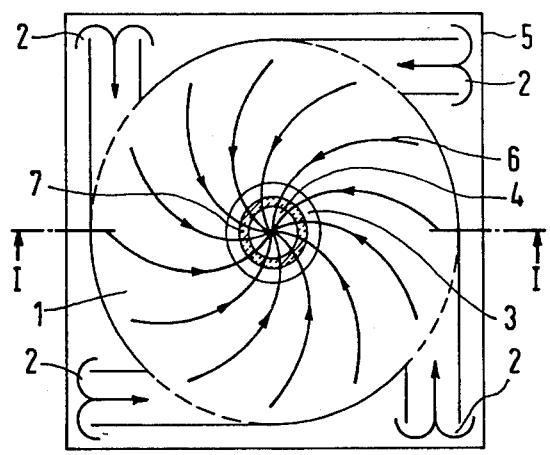
FIG. 2 is a schematic transverse cross-sectional view of the apparatus of FIG. 1.

Cooling fluid such as air, water, fluorocarbons, etc. is fed into the flow chamber 1 by the flow distributor 2. The spiral-shaped boundary-layer flow lines 6 shown in FIG. 2 are produced on the heat transfer surface in the flow chamber. Along these boundary layer flow lines, the flow velocity increases continuously toward the central discharge 4 and is led off perpendicularly to the plane of the flow through the central discharge.

The flow chamber may have a circular or any polygonal cross-section. The side walls may be cylindrical or may have aerodynamic semi-toroidal walls. The bottom of the flow chamber is at the same time the heat transfer surface. The latter may be provided with active or passive swirl attachments such as pins, baffles, tripping wires or ribs for increasing the turbulence, especially that of the boundary layer. Preferred are swirl attachments which cause turbulence in the flow boundary layer alone. This improves the heat transfer substantially. The pressure loss remains small, however.

The flow distributor 2 causes tangential inflow of the fluid into the flow chamber in order to excite the potential vortex. The flow distributor may have 1 to n inlets. The axes of the inlets may be horizontal with respect to the heat transfer plane of the flow chamber or may be inclined at an angle of preferably up to 40° with respect to the heat-exchanging surface.

The inlets into the flow chamber may also have the form of nozzles to aid the generation of turbulence in the boundary layer of the heat transfer surface.

The flow distributor may also be constructed in the form of slits which are perpendicular to the vortex plane or also in the shape of nozzles, if the slits cause the fluid to flow tangentially into the flow chamber.

The entrance of the flow distributor 2 and the exit of the flow chamber 1 are designed so that the pressure drop of the fluid takes place in the flow chamber 1.

The fluid distributor housing 5 is designed to distribute the fluid uniformly to all inlets of the flow distributor 2. It consists of a chamber with central inlet tube 3 extending from the outside. The fluid distributor is connected in a fluid-tight manner to the flow distributor 2 by 1 to n inlets. The fluid distributor housing 5 is insulated against heat transfer from the flow chamber 1.

If the flow distributor consists of only one inlet into the flow chamber, the fluid distributor housing is unnecessary.

Figure 3:
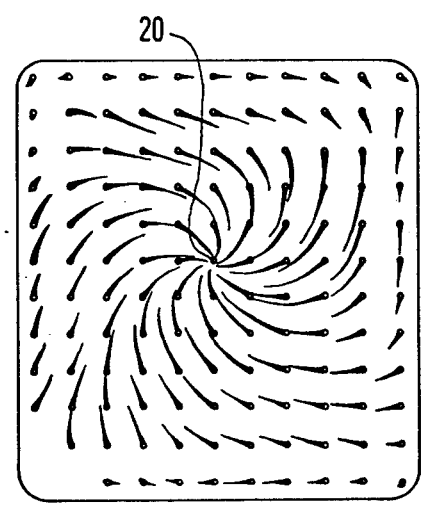
FIG. 3 is a diagram of a steady-state boundary-layer flow pattern in an apparatus according to this invention.

FIG. 3 shows a steady-state boundary-layer flow line pattern obtained in a recording by means of the wet-film diffusion method. Along the spiral-shaped flow lines, the local flow velocity increases continuously all the way to the rigidly rotating vortex core 20.

What is claimed is:

1. A method for conducting heat from a solid surface, comprising the steps of:
    feeding a fluid coolant into a flow chamber through at least one flow inlet, said flow chamber being in thermal contact with said solid surface;
    moving said coolant along a substantially spiral path in said flow chamber from said inlet to at least one flow outlet; and
    controlling the velocity of said coolant along said spiral path to produce a predetermined boundary layer thickness distribution along said path, thereby controlling the rate at which heat is transferred at various points on the portion of said solid surface in thermal contact with said flow chamber.

2. The method defined in claim 1 wherein the step of controlling the velocity of said coolant is implemented by varying the flow cross-section along said spiral path.

3. The method defined in claim 2 wherein said flow chamber is defined by a base plate and a lid facing said base plate, the step of varying the flow cross section along said spiral path being implemented by shaping said lid and said base plate to vary the distance therebetween along said spiral path.

4. The method defined in claim 3 wherein said lid has a conical shape.

5. The method defined in claim 4 wherein said flow inlet is located at the periphery of said flow chamber and said flow outlet is located substantially at the center of said flow chamber, said lid being closer to said base at said flow outlet than at the periphery of said flow chamber.

6. The method defined in claim 3 wherein said lid has a funnel shape.

7. A method for conducting heat from a solid surface, comprising the steps of:
    feeding a fluid coolant into a flow chamber through at least one flow inlet at an outer periphery of said flow chamber, said flow chamber being in thermal contact with said solid surface;
    guiding said coolant in a circular path at the outer periphery of said flow chamber; and
    increasing the velocity of said coolant as it moves along a substantially spiral path from the periphery of said flow chamber to a flow outlet substantially at the center of said flow chamber, thereby producing a vortex sink flow which equalizes the rate of heat absorption over the area of said solid surface in thermal contact with said flow chamber.

8. The method defined in claim 7 wherein the step of increasing the velocity of coolant flow is implemented by decreasing the cross-section of the flow.

9. The method defined in claim 8 wherein the step of guiding said coolant in a circular path at the outer periphery of said flow chamber is accomplished at least in part by tangentially feeding said coolant into said flow chamber, whereby the vortex sink flow is maintainable in a steady state condition.

10. The method difined in claim 9 wherein said coolant is fed into said flow chamber at a plurality of flow inlets.

11. The method defined in claim 10, further comprising the step of distributing said coolant to said plurality of flow inlets from a common distribution feed point.

12. The method defined in claim 11 wherein said flow chamber has an at least partially conical lid.

13. The method defined in claim 12, used for cooling electrical and electronic components.

14. The method defined in claim 8, wherein the spiral flow of said coolant from the periphery of said flow chamber to said flow outlet is located in a flow plane defined by said flow chamber, said flow outlet comprising a heat-insulated discharge extending substantially perpendicularly to said flow plane.

15. The method defined in claim 14 wherein said flow chamber has an at least partially conical lid.

16. The method defined in claim 15 wherein said discharge and said lid are provided with thermal insulation layers.

17. The method defined in claim 8 wherein said flow chamber has a circular transverse cross-section.

18. The method defined in claim 17 wherein said flow chamber has an at least partially conical lid.

19. The method defined in claim 8 wherein said flow chamber has a polygonal transverse cross-section.

20. The method defined in claim 19 wherein said flow chamber has an at least partially conical lid.

21. The method defined in claim 8 wherein said flow chamber has at least partially conical lid.

22. The method defined in claim 4, used for cooling electrical and electronic components.

23. The method defined in claim 8 wherein said flow chamber is defined in part by a base plate forming a heat-exchanging surface in thermal contact with said solid surface.

* * * * *